(12) United States Patent
Kuniyoshi et al.

(10) Patent No.: US 7,679,389 B2
(45) Date of Patent: Mar. 16, 2010

(54) PROBE FOR ELECTRICAL TEST AND ELECTRICAL CONNECTING APPARATUS USING IT

(75) Inventors: Shinji Kuniyoshi, Tokyo (JP); Hideki Hirakawa, Aomori (JP); Akira Soma, Aomori (JP); Takayuki Hayashizaki, Aomori (JP)

(73) Assignee: Kabushiki Kaisha Nihon Micronics, Musashino-shi, Tokyo (JP)

(*) Notice: Subject to any disclaimer, the term of this patent is extended or adjusted under 35 U.S.C. 154(b) by 166 days.

(21) Appl. No.: 11/817,493

(22) PCT Filed: Mar. 7, 2005

(86) PCT No.: PCT/JP2005/004382
§ 371 (c)(1), (2), (4) Date: Aug. 30, 2007

(87) PCT Pub. No.: WO2006/095441
PCT Pub. Date: Sep. 14, 2006

(65) Prior Publication Data
US 2009/0051382 A1    Feb. 26, 2009

(51) Int. Cl.
*G01R 31/02* (2006.01)
(52) U.S. Cl. .......... 324/762; 324/754; 324/758
(58) Field of Classification Search ......... 324/754–758, 324/762; 439/482, 65
See application file for complete search history.

(56) References Cited

U.S. PATENT DOCUMENTS

| | | | | |
|---|---|---|---|---|
| 4,116,523 A | * | 9/1978 | Coberly et al. | 439/578 |
| 5,419,807 A | * | 5/1995 | Akram et al. | 324/724 |
| 5,457,882 A | * | 10/1995 | Clarke et al. | 264/129 |
| 5,811,982 A | * | 9/1998 | Beaman et al. | 324/762 |
| 6,025,730 A | * | 2/2000 | Akram et al. | 324/758 |
| 6,127,832 A | * | 10/2000 | Comulada et al. | 324/754 |
| 6,414,501 B2 | * | 7/2002 | Kim et al. | 324/754 |
| 6,520,778 B1 | * | 2/2003 | Eldridge et al. | 439/66 |
| 6,917,698 B2 | * | 7/2005 | Obi | 382/151 |

FOREIGN PATENT DOCUMENTS

| | | |
|---|---|---|
| JP | 07-115110 | 5/1995 |
| JP | 11-26524 | 1/1999 |
| JP | 11-026524 | 1/1999 |
| JP | 2002-005957 | 1/2002 |
| JP | 2003-057264 | 2/2003 |
| JP | 2004-340654 | 12/2004 |
| JP | 20044340617 A * | 12/2004 |
| KR | 10-0352941 | 11/2002 |

* cited by examiner

*Primary Examiner*—Ha Tran T Nguyen
*Assistant Examiner*—Richard Isla Rodas
(74) *Attorney, Agent, or Firm*—Ingrassia Fisher & Lorenz, P.C.

(57) ABSTRACT

A probe includes an arm region extending in the back and forth direction, and a tip region extending downward from the front end portion of the arm region. The tip region has a pedestal portion integrally continuous to a lower edge portion at the front end side of the arm region and having an underside inclined to an imaginary axis extending in the vertical direction; and a contact portion projected from the underside of the pedestal portion and having a tip orthogonal to an imaginary axis. Thus, the position of the tip can be accurately determined.

7 Claims, 4 Drawing Sheets

PROBE FOR ELECTRICAL TEST AND ELECTRICAL CONNECTING APPARATUS USING IT

TECHNICAL FIELD

The present invention relates to a probe for electrical test of an integrated circuit and an electrical connecting apparatus using the probe.

BACKGROUND ART

A semiconductor integrated circuit is subjected to an electrical test to see whether or not it is produced in accordance with a specification. This type of electrical test is conducted by using an electrical connecting apparatus such as a probe card, a probe block, a probe unit and the like, provided with a plurality of probes (i.e., contacts) to be pressed individually against electrodes of the integrated circuits. This type of electrical connecting apparatus is used to electrically connect the electrodes of the integrated circuit and a tester.

The probes for use in this type of electrical connecting apparatus include needle-type one produced from a conductive thin metallic wire, a plate-like blade-type one, a probe element-type one using a probe element with projected electrodes formed in wiring on one surface of an electrical insulating sheet (film), and so forth.

The blade-type probe includes a single plate-type one produced from a electrical conductive metal plate, and a laminated-type one for which exposure and etching to a photoresist, and plating to the etched part are performed once or more.

Any types of the probes are cantilevered on a support member such as a wiring board, with the front ends (i.e., tips) of tip portions (i.e., contact portions) pressed against the electrodes of the integrated circuit. When the tips are pressed against the electrodes of the integrated circuit, an overdrive acts on the probes, which are curved by elastic deformation.

There is a blade-type probe which is Z-shaped and comprises: a first and a second arm portions extending in the back and forth direction at a distance in the vertical direction; a first and a second joint portions connecting the first and the second arm portions to each other at their front end and rear end portions; a tip portion continuous to the lower side of the first joint portion; and an attaching portion continuous to the upper side of the second joint portion (Patent Document 1).

There is another blade-type probe which comprises: a first and a second arm portions extending in the back and forth direction at a distance in the vertical direction; a joint portion connecting the first and the second arm portions to each other at their rear end portions; a tip portion continuous to the lower side of the front end portion of the first joint portion; and an attaching portion continuous to the upper side of the front end portion of the second joint portion (Patent Document 2).

In the conventional probe, the attaching portion is attached to a suitable support member and is supported like a cantilever on the support member, and the tip is pressed against the electrode of the integrated circuit in that state. Thereby, an overdrive acts on the probe, which is then curved at its first and second arm portions by elastic deformation.

Patent Document 1: Japanese Patent Appln. PD No. 7-115110

Patent Document 2: Japanese Patent Appln. PD No. 2003-57264

The probe used for an electrical test of the integrated circuit is generally assembled into an electrical connecting apparatus such as a probe card, assembled into the tester, and thereafter, in a state of being illuminated from the tip side (integrated circuit side), photographed from the tip side by an area sensor such as a video camera, and an output signal of the area sensor undergoes image processing, to obtain the position of the tip relative to the tester or the electrode of the integrated circuit and positioned for determining its coordinate position.

In a recent integrated circuit, the size of an electrode itself and an arrangement pitch of electrodes tend to be smaller. The size of an electrode itself and an arrangement pitch of probes (especially, tips) to be used in such an integrated circuit must be also made smaller.

In the conventional probe, however, the underside of the pedestal portion is a flat plane orthogonal to the vertical direction, so that, if the tip is made small, it is unavoidable for a reflected light from the underside of the pedestal portion to enter the area sensor, and the reflected light from the underside of the pedestal portion cannot be identified. As a result, according to the conventional probe, the position of the tip relative to the tester or the electrode of the integrated circuit cannot be accurately determined.

Unless the tip position can be determined accurately as mentioned above, accurate positioning between the tester or the integrated circuit and the probe cannot be made, so that the tip of the probe is not pressed against the electrode of the integrated circuit. Consequently, it is not possible to conduct a correct electrical test.

BRIEF SUMMARY

An object of the present invention lies in enabling accurate positioning of tips.

The probe according to the present invention comprises an arm region extending in the back and forth direction, and a tip region extending downward from the front end side of the arm region. The tip region includes a pedestal portion integrally continuous to the lower edge portion on the front end side of the arm region and having an underside inclined to an imaginary axis extending in the vertical direction, and a contact portion projected from the underside of the pedestal portion and having a tip orthogonal to the imaginary axis.

A light irradiating the tip region from below is reflected on a downward surface of the contact portion and the underside of the pedestal portion.

In the probe according to the present invention, however, the tip is orthogonal to the imaginary axis, but since the underside of the pedestal portion is inclined to the imaginary axis extending in the vertical direction, the reflected light from the underside of the pedestal portion does not advance toward the area sensor, and only the reflected light from the contact portion, especially, the tip, enters the area sensor. Thus, according to the present invention, the tip can be accurately positioned.

The underside may be V-shaped with the position of the contact portion as a vertex which is formed by two inclined surfaces inclined downward toward the contact portion. Thus, the reflected light from the underside of the pedestal portion can be surely prevented from being directed to the area sensor, thereby enabling to determine the tip position more accurately.

The contact portion may have a triangular shape as viewed from the lateral direction. Thus, the reflected light from another part than the tip of the contact portion does not advance toward the area sensor, thereby enabling to determine the tip position more accurately.

The arm region may include a first and a second arm portions extended in the back and forth direction at a vertical distance, and a first and a second joint portions connecting both arm portions at their front end side and rear end side.

The probe may further include an extended region extending upward from the second joint portion and an attaching region continuous to the upper end of the extended region.

The electrical connecting apparatus according to the present invention comprises: a probe card with a plurality of probes for electrical test; a chuck top where an integrated circuit is disposed; an inspection stage for two-dimensionally moving the chuck top at least in the back and forth direction and the lateral direction; and an area sensor disposed on the inspection stage so as to photograph at least the contact portion of at least one probe for electrical test.

Figure 1:
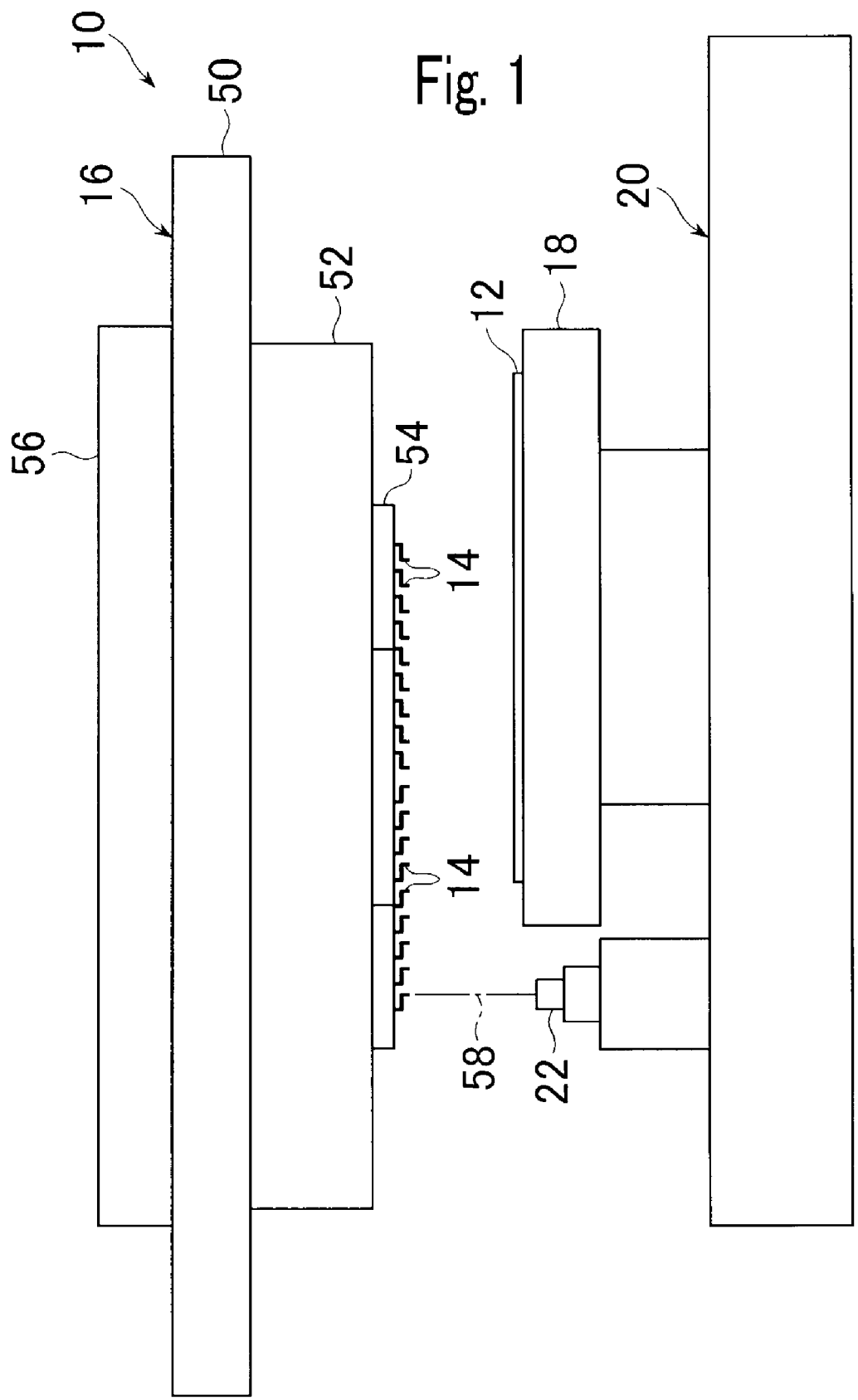
FIG. 1 is a view showing one embodiment of the electrical connecting apparatus according to the present invention.

EXPLANATION OF REFERENCE NUMERALS 10 electrical connecting apparatus
12 integrated circuit
14 probe
16 probe card
18 chuck top
20 inspection stage
22 area sensor
24 arm region
26 tip region
28 extended region
30 attaching region
32, 34 arm portion
36, 38 joint portion
40 pedestal portion
42 tip portion
44 underside of pedestal portion
46 tip

DETAILED DESCRIPTION

In the present invention, the perpendicular direction to an integrated circuit disposed in a chuck top is called a vertical direction; the longitudinal direction of a probe arm region, a back and forth direction; and a direction orthogonal to the vertical direction and back and forth direction, a lateral direction.

Those directions are, however, different depending on a chuck top which receives the integrated circuit to be electrified. For instance, therefore, the so-called vertical direction in the present invention may be used in a state of upside down or in a state of a diagonal direction.

Referring to FIG. 1, an electrical connecting apparatus 10 is used for electrically connecting electrodes of an integrated circuit 12 and a tester in an electrical test as to whether or not one or more integrated circuits 12 are produced in accordance with a specification. The integrated circuit 12 as shown is one formed on a semiconductor wafer and not cut off.

The electrical connecting apparatus 10 comprises: a probe card 16 with a plurality of probes 14; a chuck top 18 on which the integrated circuit 12 is disposed; an inspection stage 20 for dimensionally moving the chuck top 18 at least in the back and forth direction and the lateral direction; and an area sensor 22 disposed on the inspection stage 20 so as to photograph at least one electrical test probe 14.

Figure 2:
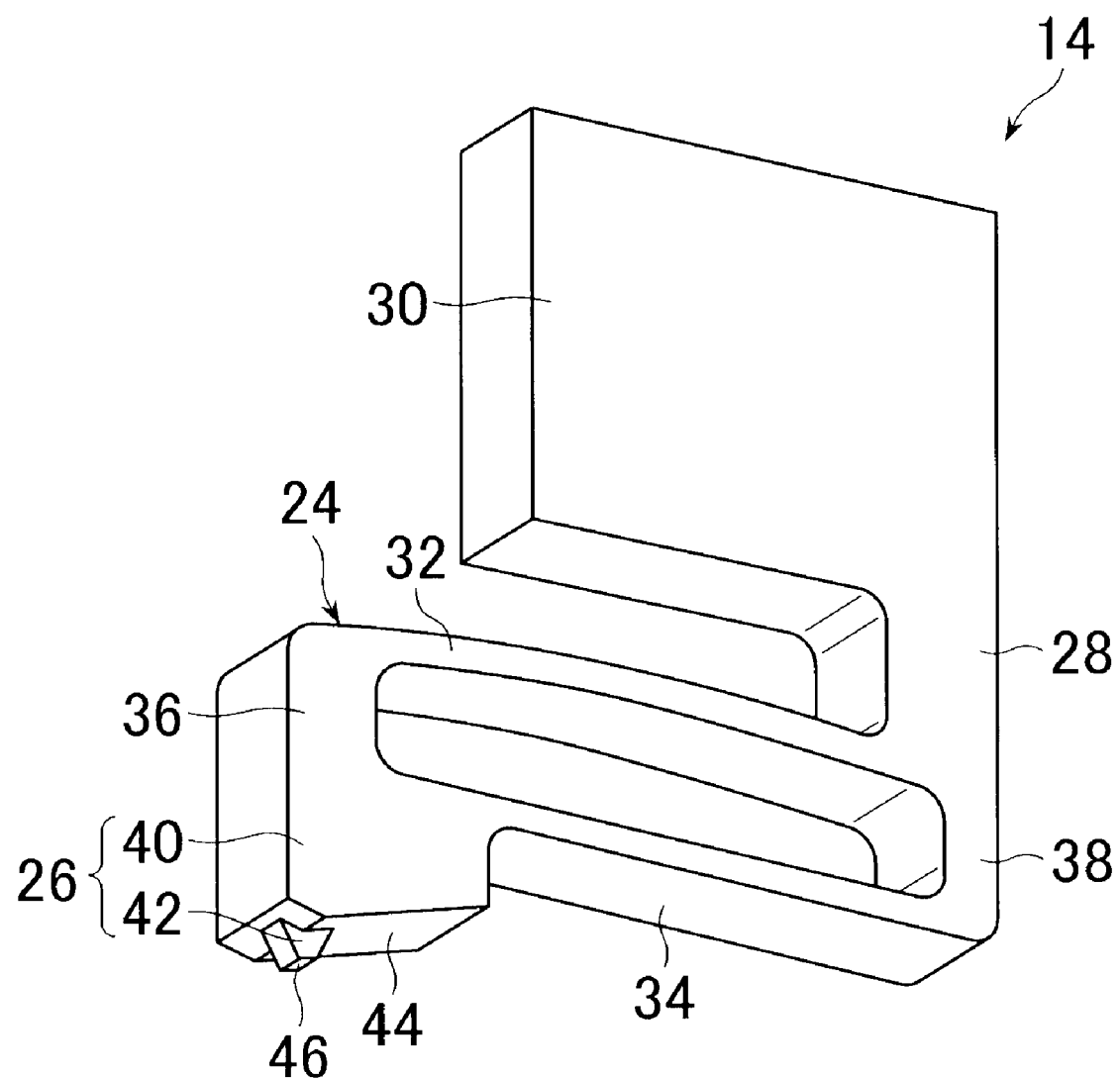
FIG. 2 is a perspective view showing one embodiment of the probe according to the present invention.

As shown in FIG. 2, each probe 14 includes an arm region 24 extending in the back and forth direction, a tip region 26 integrally continuous to the lower edge of the front end side of the arm region 24, an extended region 28 extending upward from the rear end portion of the arm region 24, and an attaching region 30 integrally continuous to the upper end of the extended region 28.

The arm region 24 is provided with a first and a second arm portions 32, 34 extended in the back and forth direction at a vertical distance, and a first and a second joint portions 36, 38 for connecting the first and the second arm portions 32 and 34 at their front end portions and the rear end portions, respectively. The extended region 28 extends upward from the second joint portion 38.

The tip region 26 has a pedestal portion 40 integrally continuous to the lower edge portion of the front end side of the second arm portion 34 and to the lower edge portion of the first joint portion 36, and a contact portion 42 projecting downward from the lower edge portion of the pedestal portion 40.

The underside 44 of the pedestal portion 40 has a V-letter shape with the position of the contact portion 42 as a vertex formed by two inclined surfaces inclined downward toward the contact portion 42.

The contact portion 42 has a shape of an isosceles triangle as viewed from the lateral direction. Therefore, each surface in the back and forth direction of the contact portion 42 is inclined to an imaginary axis extending in the vertical direction. On the other hand, the lower end surface of the contact portion 42 is formed as a flat tip 46 orthogonal to the imaginary axis so as to be pressed against the electrode of the integrated circuit 12.

The arm portions 32, 34, the first and second joint portions 36, 38, the attaching region 30, the extended region 28 and the pedestal portion 40 are shaped like an integral plate having nearly the same thickness dimensions in the lateral direction. Thus, the probe 14 is formed as a generally flat blade type probe.

On the other hand, the dimension in the lateral direction of the contact portion 42 is smaller than those of the arm portions 32, 34, the first and second joint portions 36, 38, the attaching region 30, the extended region 28 and the pedestal portion 40 in the example shown in FIG. 2.

Figure 3:
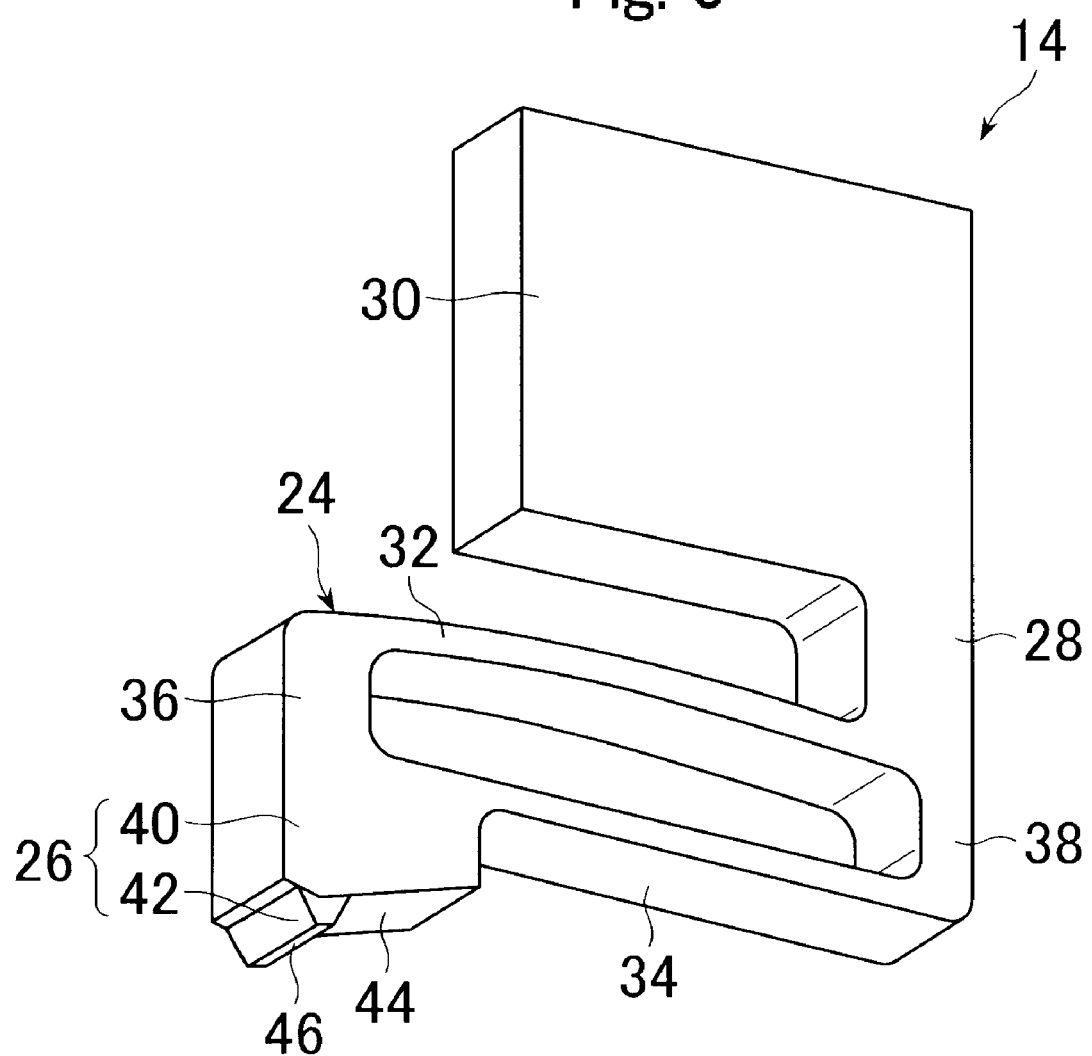
FIG. 3 is a perspective view showing another embodiment of the probe according to the present invention.

As shown in FIG. 3, however, it is possible to make the dimension in the lateral direction of the contact portion 42 the same as those of the arm portions 32, 34, the first and second joint portions 36, 38, the attaching region 30, the extended region 28 and the pedestal portion 40.

As materials of the probe 14 can be named conductive metal materials such as nickel-phosphorus alloy (Ni—P), nickel-tungsten alloy (Ni—W), rhodium (Rh), phosphor-bronze (P—Cu—Sn), nickel (Ni), palladium-cobalt alloy (Pd—Co), and palladium-nickel-cobalt (Pd—Ni—Co).

The probe 14 may be made of one of the above materials in its entirety. It is, however, the contact portion 42 may be made of a different material from at least that of the pedestal portion. In such a case, it does not matter whether the pedestal portion 40 is made of the same material as or a different material from both arm portions 32, 34, both joint portions 36, 38, the attaching region 30 and the extended region 28.

Production of the probe 14 will be facilitated by making the entire probe 14 or its parts except the contact portion 42 of the same material.

The probe 14 such as above can be made of a conductive metal material by punching process or cut process. Otherwise, it can be produced by exposing a photoresist, etching and plating to the etched portion once or more.

Each probe 14 is attached, at the upside of the attaching region 30, to a flat conductive portion formed on the underside of the probe card 16 like a cantilever by such a technique as soldering.

The probe card 16 includes a wiring board 50 made of an electrical insulating material such as epoxy containing glass, a ceramic base plate 52 attached to the underside of the wiring board 50, a probe base plate 54 attached to the underside of the ceramic base plate 52, and a reinforcing plate 56 attached to the upside of the wiring board 50.

The wiring board 50 and the ceramic base plate 52 have a plurality of wirings electrically connected to each other in one-to-one correspondence. The wiring board 50 has a plurality of tester lands electrically connected to a tester (not shown). Each tester land is electrically connected to the wirings of the wiring board 50 in one-to-one correspondence.

The probe base plate 54 has a plurality of wirings electrically connected to the wirings of the ceramic base plate 52 in one-to-one correspondence, and also a plurality of connection lands electrically connected to those wirings in one-to-one correspondence on the underside. The probes 14 are respectively attached to the connection lands in one-to-one correspondence.

The reinforcing plate 56 is made of an electrically insulating material and prevents together with the ceramic base plate 52 the wiring board 50 from flexing.

The chuck top 18 adsorbs the integrated circuit 12 in a vacuum state to maintain it so as not to move. The inspection stage 20 is a three-dimensional moving mechanism for moving the chuck top 18 in three directions, that is, back and forth, rightward and leftward, and upward and downward, and is provided with a θ moving mechanism for rotating the chuck top 18 angularly about the axis extending in the vertical direction.

Figure 4:
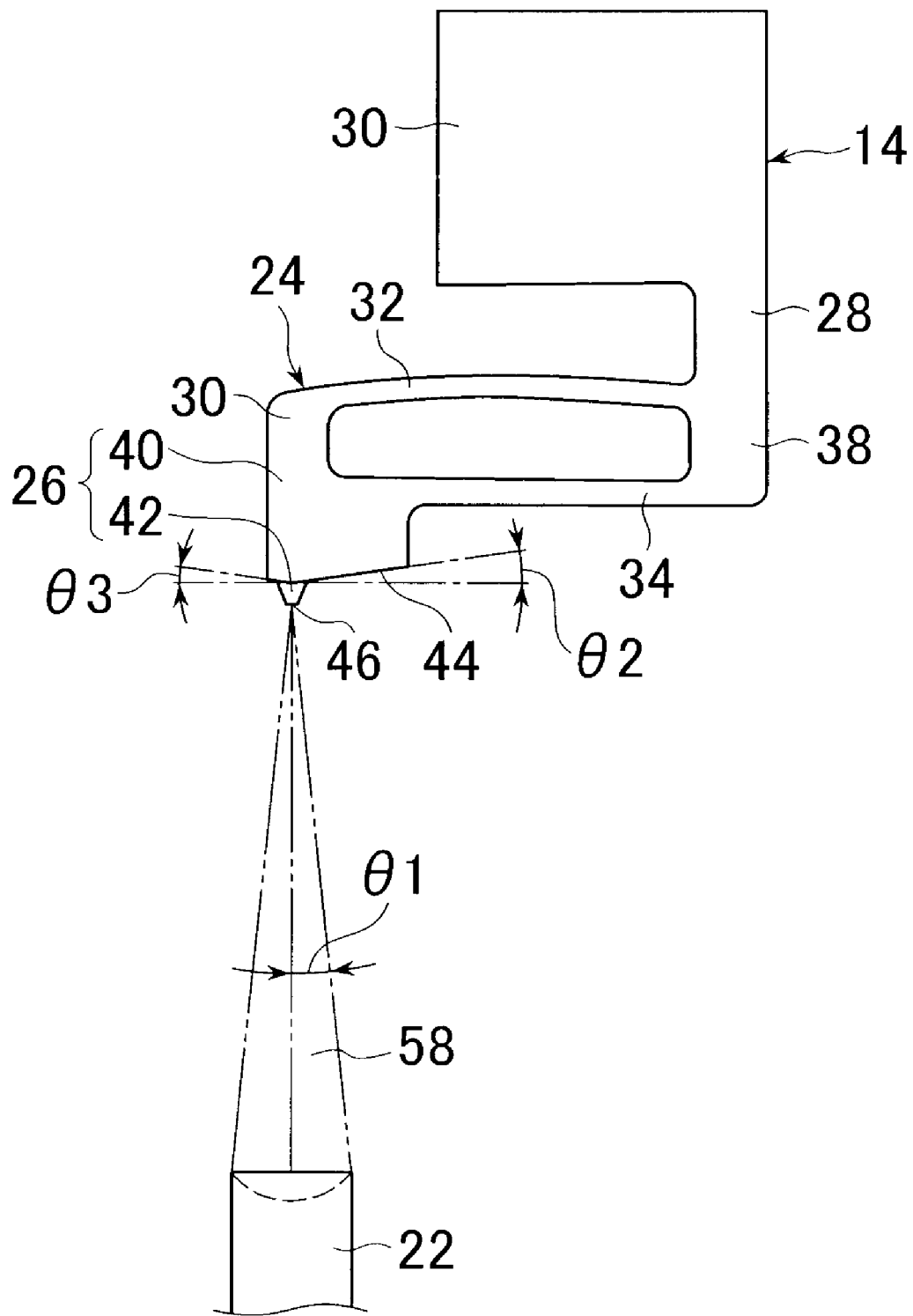
FIG. 4 is a diagram to explain a relation between a light beam directed from the area sensor to the front end of the prove and a light beam directed from the probe to the area sensor.

The area sensor 22, as shown in FIG. 4, focuses a light beam 58, orients it toward the tip 46 of a specific probe 14 to illuminate the tip 46 and its neighborhood, receives a reflected light from the tip 46 and its neighborhood and converts the reflected light into an electrical signal.

An output signal of the area sensor 22 is supplied to an image processor which determines the coordinate position of the specific probe 14.

In FIG. 4, an opening angle θ1 of the light 58 can make inclination angles θ2 and θ3 of the underside 44 smaller. The angles θ1 and θ2 may be the same or different.

In the foregoing electrical connecting apparatus 10, the light beam 58 irradiated the tip region 26 from below is reflected on the tip 46 of the contact portion 42 and the underside 44 of the pedestal 40.

However, in the probe 14, the tip 46 is orthogonal to the imaginary axis extending in the vertical direction, the underside 44 of the pedestal portion 40 is inclined to the imaginary axis extending in the vertical direction. Thus, the reflected light from the underside 44 does not advance toward the area sensor 22, and only the reflected light from the contact portion 42, particularly from the tip 46, enters the area sensor 22, thereby enabling to determine the position of the tip 46 of the specific probe 14 accurately.

According to the above-mentioned probe 14, since the underside 44 is V-shaped with the position of the contact portion 42 as a vertex formed by two inclined surfaces inclined downward toward the contact portion 42, thereby surely preventing the reflected light from the downside 44 from being directed toward the area sensor 22. As a result, the position of the tip 46 can be more accurately determined.

Also, since the contact portion 42 has a triangular shape as viewed from the lateral direction, a reflected light from other portions than the tip 44 does not advance toward the area sensor. Consequently, the position of the tip 46 can be more accurately determined.

The probe 14 may have a single arm region. In such a case, it is possible to omit the joint portions 36, 38, forming the tip region 26 at the front end side of the arm portion integrally therewith, and to form the extended region 28 at the rear end side of the arm portion integrally therewith.

The present invention can be used not only for an electrical test of a non-cut integrated circuit formed on a semiconductor wafer but also for an electrical test of a cut-off integrated circuit.

The present invention is not limited to the foregoing embodiments but can be modified in various ways without departing from its purport.

What we claim is:

1. A probe for electrical test comprising an arm region extending in a back and forth direction, and a tip region extending downward from the front end portion of said arm region;
    wherein said tip region is provided with a pedestal portion integrally continuous to a lower edge portion at a front end side of said arm region, the pedestal portion having a first exposed underside plane inclined to an imaginary axis extending in the vertical direction and a second exposed underside plane inclined to the imaginary axis, the first and second exposed underside planes meeting at a vertex, and said tip region having a contact portion projected from the vertex, the contact portion having first and second exposed sidewalls terminating at the first and second exposed underside planes and inclined at an angle to the imaginary axis, and said contact portion having a tip surface orthogonal to the imaginary axis.

2. The probe for electrical test claimed in claim 1, wherein said contact portion has a triangular shape as viewed from the lateral direction.

3. The probe for electrical test claimed in claim 1, wherein said arm region includes:
    first and second arm portions extending in the back and forth direction at a distance in the vertical direction; and
    first and second joint portions connecting both arm portions at their front ends side and rear ends.

4. The probe for electrical test claimed in claim 3, further comprising an extended region extending upward from said second joint portion, and an attaching region continuous to an upper end of said extended region.

5. An electrical connecting apparatus comprising:
    a probe card provided with a plurality of probes for electrical test as claimed in claim 1;
    a chuck top where an integrated circuit disposed;
    an inspection stage for moving said chuck top two-dimensionally at least in the back and forth direction and the lateral direction; and
    an area sensor disposed in said inspection stage so that at least a contact portion of at least one probe for electrical test can be photographed, wherein the first and second exposed underside planes of the probes for electrical test are arranged to reflect light away from the area sensor.

6. The probe for electrical test claimed in claim 1, wherein the pedestal portion and the contact portion are formed from different materials.

7. A probe for electrical testing of an integrated circuit, the probe comprising:
- an arm region extending in a back and forth direction, the arm region corresponding to a horizontal reference plane;
- a pedestal portion extending downward from the arm region in a vertical direction, the pedestal portion having a first exposed underside plane inclined relative to the horizontal reference plane, and the pedestal portion having a second exposed underside plane inclined relative to the horizontal reference plane, the first and second exposed underside planes meeting at a vertex that is located below the arm region in the vertical direction; and
- a tip contact portion projected from the vertex, the tip contact portion having first and second exposed sidewalls terminating at the first and second exposed underside planes and inclined relative to the horizontal reference plane, the tip contact portion having a tip surface orthogonal to the vertical direction, and the tip contact portion being located below the vertex in the vertical direction;
- wherein the first and second exposed underside planes are arranged to reflect light, which is originally oriented toward the tip contact portion along the vertical direction, in directions that are inclined relative to the vertical direction.

* * * * *